United States Patent
Edmonds et al.

(10) Patent No.: US 12,037,702 B2
(45) Date of Patent: Jul. 16, 2024

(54) SINGLE CRYSTAL SYNTHETIC DIAMOND MATERIAL

(71) Applicant: ELEMENT SIX TECHNOLOGIES LIMITED, Didcot (GB)

(72) Inventors: Andrew Mark Edmonds, Didcot (GB); Matthew Lee Markham, Didcot (GB); Pierre-Olivier Francois Marc Colard, Didcot (GB)

(73) Assignee: Element Six Technologies Limited, Didcot (GB)

( * ) Notice: Subject to any disclaimer, the term of this patent is extended or adjusted under 35 U.S.C. 154(b) by 0 days.

(21) Appl. No.: 18/488,602

(22) Filed: Oct. 17, 2023

(65) Prior Publication Data
US 2024/0060210 A1    Feb. 22, 2024

Related U.S. Application Data

(62) Division of application No. 17/593,200, filed as application No. PCT/EP2020/058945 on Mar. 30, 2020, now Pat. No. 11,821,107.

(30) Foreign Application Priority Data

Mar. 29, 2019  (GB) .................................. 1904435.3

(51) Int. Cl.
   *C30B 25/20* (2006.01)
   *C23C 16/00* (2006.01)
   (Continued)

(52) U.S. Cl.
   CPC ............ *C30B 25/20* (2013.01); *C23C 16/006* (2013.01); *C23C 16/02* (2013.01); *C23C 16/27* (2013.01);
   (Continued)

(58) Field of Classification Search
   CPC ....... C30B 29/04; C30B 25/16; C30B 25/165; C23C 16/27
   See application file for complete search history.

(56) References Cited

U.S. PATENT DOCUMENTS

| | | | |
|---|---|---|---|
| 7,172,655 B2 | 2/2007 | Twitchen et al. | |
| 10,273,598 B2 * | 4/2019 | Twitchen | ................ C30B 29/04 |

(Continued)

FOREIGN PATENT DOCUMENTS

| | | |
|---|---|---|
| CN | 107740184 A | 2/2018 |
| JP | H07277890 A | 10/1995 |

(Continued)

OTHER PUBLICATIONS

U.S. Appl. No. 17/593,200, Notice of Allowance dated Sep. 20, 2023, 8 pages.

(Continued)

*Primary Examiner* — Jaehwan Oh
(74) *Attorney, Agent, or Firm* — Kilpatrick Townsend & Stockton LLP

(57) ABSTRACT

Single crystal CVD diamond material comprising a total nitrogen concentration of at least 5 ppm and a neutral single substitutional nitrogen, $N_s^0$, to total single substitutional nitrogen, $N_s$, ratio of at least 0.7. Such a diamond is observed to have a relatively low amount of brown colouration despite the relatively high concentration of nitrogen. A method of making the single crystal diamond is also disclosed, the method including growing the CVD diamond in process gases comprising 60 to 200 ppm nitrogen, in addition to a carbon-containing gas, and hydrogen, wherein the ratio of carbon atoms in the carbon-containing gas to hydrogen atoms in the hydrogen gas is 0.5 to 1.5%.

8 Claims, 3 Drawing Sheets

(51) Int. Cl.
  *C23C 16/02* (2006.01)
  *C23C 16/27* (2006.01)
  *C23C 16/56* (2006.01)
  *C30B 25/16* (2006.01)
  *C30B 25/18* (2006.01)
  *C30B 29/04* (2006.01)
  *C30B 29/68* (2006.01)
  *C30B 33/00* (2006.01)

(52) U.S. Cl.
  CPC .............. *C23C 16/56* (2013.01); *C30B 25/16* (2013.01); *C30B 25/186* (2013.01); *C30B 25/205* (2013.01); *C30B 29/04* (2013.01); *C30B 29/68* (2013.01); *C30B 33/00* (2013.01)

(56) References Cited

U.S. PATENT DOCUMENTS

| | | | |
|---|---|---|---|
| 2004/0194690 A1 | 10/2004 | Twitchen et al. | |
| 2014/0306707 A1* | 10/2014 | Walsworth .......... | G01R 33/4616 324/309 |
| 2014/0335339 A1 | 11/2014 | Dhillon et al. | |

FOREIGN PATENT DOCUMENTS

| | | |
|---|---|---|
| WO | 2004046427 A1 | 6/2004 |
| WO | 2009154577 A1 | 12/2009 |
| WO | 2010010344 A1 | 1/2010 |
| WO | 2010010352 A1 | 1/2010 |
| WO | 2010149775 A1 | 12/2010 |
| WO | 2011076643 A1 | 6/2011 |
| WO | 2016144256 A1 | 9/2016 |
| WO | 2017112399 A1 | 6/2017 |

OTHER PUBLICATIONS

United Kingdom Patent Application No. GB1904435.3, Combined Search and Examination Report dated Jun. 19, 2019, 8 pages.
United Kingdom Patent Application No. GB2004593.6, Combined Search and Examination Report dated Jun. 30, 2020, 9 pages.
Kehayias et al., "Imaging Crystal Stress in Diamond Using Ensembles of Nitrogen-Vacancy Centers", Physical Review B, Nov. 11, 2019, pp. 174103-1-174103-8, vol. 100, No. 17, American Physical Society.
International Patent Application No. PCT/EP2020/058945, International Search Report and Written Opinion dated Jun. 22, 2020, 12 pages.
Ralchenko et al., "Large-Area Diamond Deposition by Microwave Plasma", Diamond and Related Materials, 1997, vol. 6, pp. 417-421, Elsevier Science SA.
Vlasov et al., "Relative Abundance of Single and Vacancy-Bonded Substitutional Nitrogen in CVD Diamond", Physica Status Solidi (A), 2000, pp. 83-90, vol. 181, No. 1, Applied Research.

* cited by examiner

SINGLE CRYSTAL SYNTHETIC DIAMOND MATERIAL

CROSS REFERENCE TO RELATED APPLICATIONS

This application is a division of and claims priority to U.S. patent application Ser. No. 17/593,200 filed on Sep. 10, 2021, which is a U.S. national phase of International Patent Application No. PCT/EP2020/058945, filed on Mar. 30, 2020, which claims the benefit of United Kingdom Patent Application No. 1904435.3, filed on Mar. 29, 2019, each of which is incorporated herein by reference in its entirety.

FIELD

The invention relates to the field of single crystal synthetic diamond material, in particular single crystal synthetic diamond material manufactured using a Chemical Vapour Deposition (CVD) method.

BACKGROUND

Point defects in synthetic diamond material, particularly quantum spin defects and/or optically active defects, have been proposed for use in various imaging, sensing, and processing applications including: luminescent tags; magnetometers; spin resonance devices such as nuclear magnetic resonance (NMR) and electron spin resonance (ESR) devices; spin resonance imaging devices for magnetic resonance imaging (MRI); quantum information processing devices such as for quantum communication and computing; magnetic communication devices; and gyroscopes for example.

It has been found that certain defects are particularly useful for sensing and quantum processing applications when in their negative charge state. For example, the negatively charged nitrogen-vacancy defect ($NV^-$) in synthetic diamond material has attracted a lot of interest as a useful quantum spin defect because it has several desirable features including:

(i) Its electron spin states can be coherently manipulated with high fidelity and have an extremely long coherence time (which may be quantified and compared using the transverse relaxation time $T_2$ and/or $T_2^*$);

(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and (iii) Its electronic structure comprises emissive and non-emissive electron spin states, which allows the electron, spin state of the defect to be read out through photons. This is convenient for reading out information from synthetic diamond material used in sensing applications such as magnetometry, spin resonance spectroscopy, and imaging. Furthermore, it is a key ingredient towards using $NV^-$ defects as qubits for long-distance quantum communications and scalable quantum computation. Such results make the $NV^-$ defect a competitive candidate for solid-state quantum information processing (QIP).

The $NV^-$ defect in diamond consists of a substitutional nitrogen atom adjacent to a carbon vacancy. Its two unpaired electrons form a spin triplet in the electronic ground state ($^3A$), the degenerate $m_s=+1$ sublevels being separated from the $m_s=0$ level by 2.87 GHz. The electronic structure of the $NV^-$ defect is such that the $m_s=0$ sublevel exhibits a high fluorescence rate when optically pumped. In contrast, when the defect is excited in the $m_s=+1$ levels, it exhibits a higher probability to cross over to the non-radiative singlet state ($^1A$) followed by a subsequent relaxation into $m_s=0$. As a result, the spin state can be optically read out, the $m_s=0$ state being "bright" and the $m_s=+1$ states being dark. When an external magnetic field or strain field is applied, the degeneracy of the spin sublevels $m_s=\pm 1$ is broken via Zeeman splitting. This causes the resonance lines to split depending on the applied magnetic/strain field magnitude and its direction. This dependency can be used for magnetometry by probing the resonant spin transitions using microwaves (MW) and using optically detected magnetic resonance (ODMR) spectroscopy to measure the magnitude and, optionally, the direction of the applied magnetic field.

$NV^-$ defects in synthetic diamond material can be formed in a number of different ways including:
(i) formation during growth of the synthetic diamond material where a nitrogen atom and a vacancy are incorporated into the crystal lattice as a nitrogen-vacancy pair during growth;
(ii) formation after diamond material synthesis from native nitrogen and vacancy defects incorporated during the growth process by post-growth annealing the material at a temperature (around 800° C.) which causes migration of the vacancy defects through the crystal lattice to pair up with native single substitutional nitrogen defects;
(iii) formation after diamond material synthesis from native nitrogen defects incorporated during the growth process by irradiating the synthetic diamond material to introduce vacancy defects and then subsequently annealing the material at a temperature which causes migration of the vacancy defects through the crystal lattice to pair up with native single substitutional nitrogen defects;
(iv) formation after diamond material synthesis by implanting nitrogen defects into the synthetic diamond material after diamond material synthesis and then annealing the material at a temperature which causes migration of the native vacancy defects through the crystal lattice to pair up with implanted single substitutional nitrogen defects; and
(v) formation after diamond material synthesis by irradiating the synthetic diamond material to introduce vacancy defects, implanting nitrogen defects into the synthetic diamond material before or after irradiation, and annealing the material at a temperature which causes migration of the vacancy defects through the crystal lattice to pair up with implanted single substitutional nitrogen defects.

Various different types of diamond material have been disclosed in the prior art for use in various different types of magnetometry applications including WO2010/010352 and WO2010/010344 which disclose low nitrogen content single crystal chemical vapour deposited (CVD) diamond materials for applications such as magnetometry, and WO2010/149775 which discloses irradiated and annealed single crystal CVD diamond materials for applications such as magnetometry.

For some quantum applications, it is desirable to produce material with high concentrations of NV centres. CVD diamond material with a high nitrogen concentration is therefore required as a starting material. Use of high nitrogen concentration CVD diamond material presents a challenge because although high (several ppm and above) levels of nitrogen can be incorporated into CVD diamond material, such diamond material is typically brown owing to the presence of intrinsic defects such as vacancy clusters, and extrinsic defects such as NVH and possibly other H-related defects. Brown colouration is undesirable as it reduces the transparency of the material. Intrinsic and extrinsic defects are also likely to reduce the coherence time ($T_2$ or $T_2^*$) of produced NV centres in such material, detrimentally affecting the performance of sensors based on such material.

It would be desirable to produce a diamond material with a relatively high concentration of incorporated nitrogen, while keeping the brown colouration and defects associated with a brown colouration to low levels. However, these are competing requirements and it is difficult to increase nitrogen incorporation without also increasing the brown colouration.

U.S. Pat. No. 7,172,655 applies an annealing technique to reduce the brownness of a single crystal diamond material. The most complete removal of brown colour is achieved at annealing temperatures above about 1600° C. and generally requires diamond-stabilising pressures. However, such treatment is an expensive and complicated process in which yields can be seriously affected by cracking of stones etc. Furthermore, due to defect diffusion, such an annealing strategy is not necessarily consistent with avoiding nitrogen aggregation or with the fabrication of high performance electronic devices, where controlling the location of defects may be important. It is therefore considered desirable to be able to directly synthesize diamond material that is not brown but retains the desired high concentration of $N_s^0$ using CVD methods.

WO 2011/076643 discloses methods for synthesizing CVD diamond in the presence of oxygen-containing species in order to reduce defects associated with brown colouration, but at relatively low levels of nitrogen. Furthermore, plasmas containing oxygen can be relatively unstable and more prone to forming arcs compared to plasmas formed from a process gas mixture that is predominantly based on hydrogen. This can be counteracted by forming a plasma at lower pressures but this increases the time to grow diamond and increases the cost.

SUMMARY

It is desirable to provide a diamond material and a method of manufacturing diamond material that has a low brown coloration but high levels of nitrogen in order to form NV centres.

According to a first aspect, there is provided single crystal CVD diamond material comprising a total nitrogen concentration of at least 5 ppm and a neutral single substitutional nitrogen, $N_s^0$, to total single substitutional nitrogen, $N_s$, ratio of at least 0.7. Such a diamond is observed to have a relatively low amount of brown colouration despite the relatively high concentration of nitrogen.

As an option, the neutral single substitutional nitrogen, $N_s^0$, to total single substitutional nitrogen, $N_s$, ratio is at least 0.8.

The total nitrogen concentration is preferably selected from any of at least 10 ppm and optionally at least 15 ppm.

The single crystal CVD diamond material optionally has a thickness selected from any of 100 nm to 4 mm, 200 nm to 1 mm, or 500 nm to 50 µm.

As an option, the single crystal diamond material has, at a temperature of 20° C., a low optical birefringence, indicative of low strain, such that in a sample measured over an area of at least 3 mm×3 mm, for 98% of the area analysed, the sample remains in first order (δ does not exceed π/2), and the maximum value of $\Delta n_{[average]}$, the average value of the difference between the refractive index for light polarised parallel to the slow and fast axes averaged over the sample thickness does not exceed $5 \times 10^{-5}$.

As an option, the single crystal diamond material has a uniform strain, such that over an area of at least 1×1 mm, at least 90 percent of points display a modulus of strain-induced shift of NV resonance of less than 200 kHz, wherein each point in the area is a resolved region of 50 µm². As a further option, the modulus of strain-induced shift of NV resonance is selected from any of less than 150 kHz, less than 100 kHz, less than 50 kHz, and less than 25 kHz. As a further option, the area in the is in a central 70% of the single crystal diamond material, and within the area there are no series of more than 1000 contiguous points having a modulus of strain-induced shift of NV resonance lines exceeding 150 kHz. Optionally, within the area there are no series of more than 500 contiguous points having a modulus of strain-induced shift of NV resonance lines exceeding 150 kHz.

As an option, a total volume of the single crystal CVD diamond material is selected from any of at least 0.04 mm³, 0.07 mm³ and 0.1 mm³.

After the single crystal CVD diamond material has been irradiated and annealed, a product of a concentration of NV⁻ defects and decoherence time $T_2^*$ measured at room temperature is at least 2.0 ppm·µs, preferably 2.5 ppm·µs, preferably 3 ppm·µs, preferably 5 ppm·µs.

According to a second aspect, there is provided a single crystal diamond composite body comprising a first layer of single crystal CVD diamond material as described in the first aspect, and a second layer of single crystal diamond material having a total nitrogen concentration lower than that of the first layer.

The second layer of single crystal diamond material optionally comprises any of type IIa HPHT single crystal diamond, annealed HPHT single crystal diamond, natural single crystal diamond and CVD single crystal diamond.

According to a third aspect, there is provided a method of making single crystal CVD diamond as described above. The method comprises:

locating a single crystal diamond substrate over a substrate holder within a chemical vapour deposition reactor;

feeding process gases into the reactor, the process gases comprising 60 to 200 ppm nitrogen, a carbon-containing gas, and hydrogen, wherein the ratio of carbon atoms in the carbon-containing gas to hydrogen atoms in the hydrogen gas is 0.5 to 1.5%; and growing single crystal CVD diamond material on a surface of the single crystal diamond substrate.

As an option, the ratio of carbon atoms in the carbon-containing gas to hydrogen atoms in the hydrogen gas is no more than 1.0%;

As an option, the method further comprises locating a plurality of single crystal diamond substrates over the substrate holder to give a more efficient production process.

As an option, the method further comprises irradiating and annealing the diamond material to increase a number of NV defects in the diamond material.

The single crystal diamond substrate optionally has a total nitrogen concentration of less than 5 ppm.

As an option, the method further comprises applying a mask to the diamond substrate prior to growing the single crystal CVD diamond material on the surface of the single crystal diamond substrate.

As a further option, the carbon in the carbon-containing gas comprises any of at least 99 percent $^{12}C$; at least 99.9 percent $^{12}C$; and at least 99.99 percent $^{12}C$.

According to a fourth aspect, there is provided a method of analysing a diamond, the method comprising measuring an optical property of the diamond, the measurement comprising any of C* or L*, and empirically mapping the measured optical property to a $N_s^0$ to $N_s$ ratio.

BRIEF DESCRIPTION OF DRAWINGS

Non-limiting embodiments will now be described by way of example and with reference to the accompanying drawings in which.

DETAILED DESCRIPTION

Positively charged substitutional nitrogen ($N_s^+$) is indicative of the presence of defects such as vacancy clusters, distorted $sp^3$ bonding and extrinsic defects such as NVH. These defects significantly contribute to an observed brown colour in single crystal diamond. On the other hand, the $N_s^0$ defect is not typically associated with defects that give rise to a brown colour. However, as higher levels of nitrogen are incorporated into the diamond crystal lattice, the concentration of defects that give rise to the undesirable brown colour also increases. As mentioned above, it is desirable to reduce the brown colour in order to limit the reduction of the coherence time ($T_2/T_2^*$) of produced NV in such material. Furthermore, increased brown colour leads to higher optical absorption, making light pass less efficiently through the diamond in order to excite an NV centre in the diamond due to absorption of the exciting light source. Similarly, increase brown colour makes it more difficult to detect an optical signal passing through the CVD diamond material due to absorption of that optical signal.

It is desirable to have a high concentration of substitutional nitrogen in the diamond lattice because subsequent annealing gives rise to migration of vacancies towards substitutional nitrogen to form NV centres as discussed above. The inventors have addressed the competing requirements of high nitrogen concentration and low brown colour and produced a high nitrogen CVD diamond material that has improved colour properties.

Figure 1:
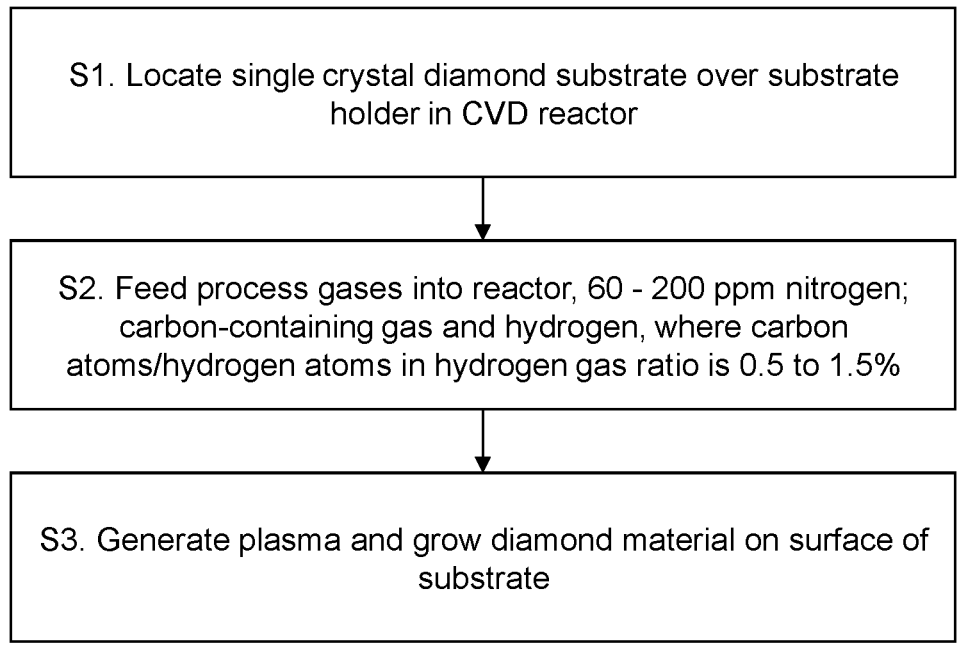
FIG. 1 is a flow chart showing exemplary steps for making single crystal CVD diamond.

Referring to FIG. 1, there is provided a flow diagram showing exemplary steps for making single crystal CVD diamond. The following numbering corresponds to that of FIG. 1:

S1. A single crystal diamond substrate is located on a substrate holder and then located in a CVD reactor. Note that in a typical process, a plurality of single crystal diamond substrates are located on the substrate holder.

S2. Process gases are fed into the CVD reactor. The process gases comprise between 60 ppm and 200 µm nitrogen, a carbon-containing gas and hydrogen. The ratio of carbon atoms in the carbon-containing gas to hydrogen atoms in the hydrogen gas is between 0.5% and 1.5%. This ratio may be lower than 1.0%

S3. A plasma of the process gases is formed within the reactor and single crystal CVD diamond material is grown on a surface of the single crystal diamond substrate.

Such a process gives rise to a single crystal CVD diamond material that has a total nitrogen concentration of at least 5 ppm and a neutral single substitutional nitrogen, $N_s^0$, to total single substitutional nitrogen, $N_s$, ratio of at least 0.7. It has surprisingly been found that this gives a material with low brown colouration but a high degree of nitrogen incorporation.

Four exemplary single crystal CVD diamond runs were carried out in an 896 MHz microwave CVD reactor fraction using methane as a carbon process gas and hydrogen, and in the absence of oxygen. The ratio of methane to hydrogen was varied while the pressure and power density was kept at the same level for each run to give a nominal substrate temperature of around 1000° C. It was found that the incorporation efficiency of nitrogen into the diamond matrix was increased with increasing ratio of hydrogen to methane. It was also found that increasing ratio of hydrogen to methane gave rise to an increase in the ratio of neutral single substitution nitrogen ($N_s^0$) compared to total single substitution nitrogen ($N_s$) which, in turn produced diamond with a decrease in brown colouration.

The substrates were carefully prepared to minimise any defects that could grow into the CVD single crystal diamond using techniques described in WO 2011/076643. The substrates were mounted on a tungsten substrate carrier before placing the substrate carrier in the CVD reactor and growing CVD single crystal diamond. The concentrations of the gases in the synthesis environment were controlled by altering the concentration of the gases in the process gas before inputting the source gas into the CVD reactor. Therefore, the ratios given herein for gas concentrations in the process gas have been determined by the process gas composition before it is inputted into the CVD reactor and have not been measured in the synthesis environment in situ. Growth temperatures and microwave power conditions were similar to those described in WO2010/010352.

Table 1 shows the conditions under which the four exemplary single crystal CVD diamonds were grown at substrate carrier temperatures above 850° C.:

TABLE 1

Exemplary single crystal CVD diamond growth conditions.

|  | Comparative Example 1 | Example 2 | Example 3 | Example 4 |
|---|---|---|---|---|
| $CH_4/H_2$ ratio % | 4.3 | 2.2 | 1.80 | 1.3 |
| C in $CH_4$ to H in $H_2$ ratio | 2.15 | 1.10 | 0.90 | 0.65 |
| $N_2$ gas ppm | 155 | 65 | 65 | 65 |

After growth of the CVD synthetic diamond material, the samples were processed to remove the substrate and create freestanding diamond plates to facilitate optical examination and characterisation of the material.

The ratio of carbon in the carbon-containing gas to hydrogen in the hydrogen containing is given above. Note that the ratio of carbon containing gas to hydrogen will change depending on which carbon containing gas is used and the number of carbon atoms in a molecule of that carbon-containing gas.

Figure 2:
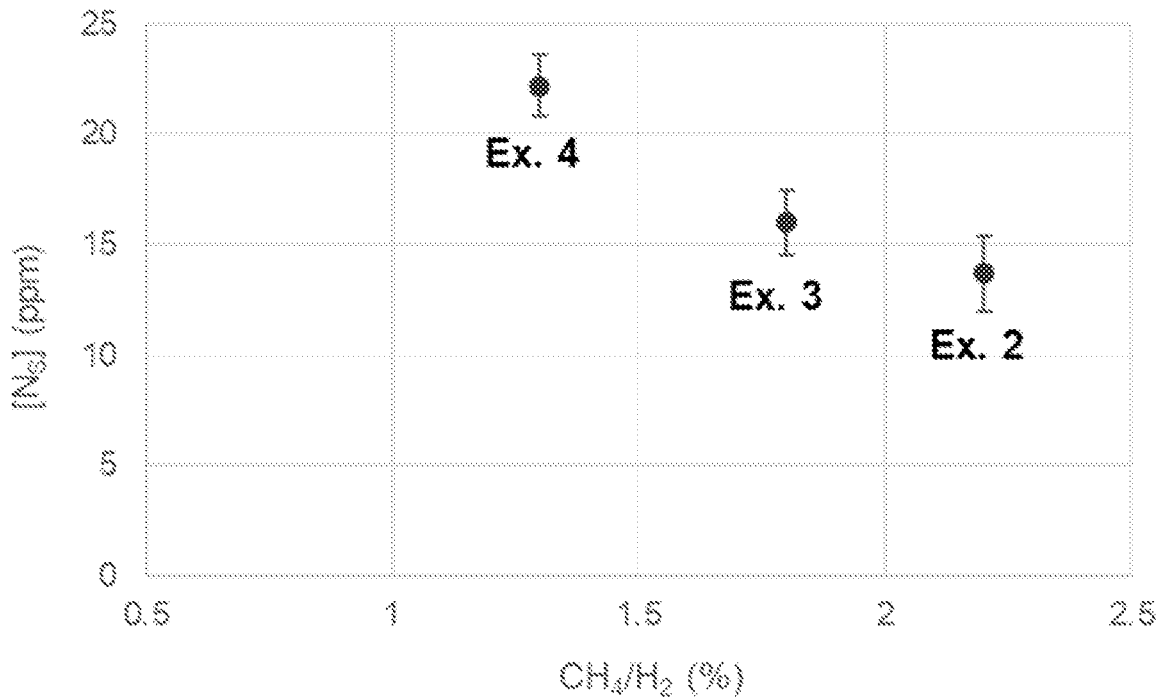
FIG. 2 is a graph showing a relationship between the ratio of $CH_4$ and $H_2$ in the process gas and the amount of substitutional nitrogen in the resultant synthetic CVD diamond.

It has been found that reducing the $CH_4$ to $H_2$ ratio in the process gas increases the amount of substitutional nitrogen incorporated in the diamond lattice. Referring to FIG. 2, there is shown a graph showing a relationship between the ratio of $CH_4$ and $H_2$ in the process gas and the amount of substitutional nitrogen in the resultant synthetic CVD diamond.

The concentration of $N_s^0$ present in the synthetic CVD diamond material of the present invention may be measured using the 270 nm peak using UV-visible absorption spectroscopy. The technique of UV-visible absorption spectroscopy is well-known in the art.

The concentration of $N_s^0$ in synthetic CVD diamond material may be found using Fourier-Transform Infrared (FTIR) spectroscopy by measuring infrared absorption peaks at wavenumbers of 1332 $cm^{-1}$ and 1344 $cm^{-1}$. Using a spectrometer with a resolution of 1 $cm^{-1}$, the conversion factors between the absorption coefficient values in $cm^{-1}$ for the peaks at 1332 $cm^{-1}$ and 1344 $cm^{-1}$ and the concentrations of single nitrogen in the positively-charged and neutral states respectively are 5.5 and 44. However, it must be noted that the value derived from the 1332 $cm^{-1}$ peak is only an upper limit. FTIR can therefore be used to measure both $N_s^0$ and $N_s^+$.

Alternatively, the total concentration of nitrogen may be determined using secondary ion mass spectroscopy (SIMS). SIMS has a lower detection limit for nitrogen in diamond of approximately 0.1 ppm and its use is well-known in the art. For synthetic diamond produced by a CVD method, the vast majority of nitrogen present in the solid is in the form of neutral single substitutional nitrogen, Ns0, and therefore, whilst SIMS measurements of the total nitrogen concentration inevitably provide an upper limit to the concentration of $N_s^0$, they typically also provide a reasonable estimate of its actual concentration.

Alternatively, the amount of $N_s^0$ may be determined using electron paramagnetic resonance (EPR). In measurements conducted using EPR, the abundance of a particular paramagnetic defect (e.g. the neutral single-substitutional nitrogen defect, $N_s^0$) is proportional to the integrated intensity of all the EPR absorption resonance lines originating from that centre. This permits the concentration of the defect to be determined by comparing the integrated intensity to that which is observed from a reference sample, provided care is taken to prevent or correct for the effects of microwave power saturation. Since continuous wave EPR spectra are recorded using field modulation, double integration is required to determine the EPR intensity and hence the defect concentration. To minimise the errors associated with double integration, base line correction, finite limits of integration, etc., especially in cases where overlapping EPR spectra are present, a spectral fitting method is employed to determine the integrated intensity of the EPR centres present in the sample of interest. This entails fitting the experimental spectra with simulated spectra of the defects present in the sample and determining the integrated intensity of each from the simulation. In the case of low nitrogen concentrations, it is often necessary to use modulation amplitudes approaching or exceeding the line width of the EPR signals to achieve a good signal/noise ratio, which allows the $N_s$ concentration to be determined with a reproducibility of better than ±5%.

Example 2 contained 14 ppm $N_s$, example 3 contained 16 ppm $N_s$ and example 4 contained 22 ppm $N_s$. These values were obtained using a combination of $N_s^0$ and $N_s^+$ concentrations measured by FTIR, as described above on the assumption that other forms of $N_s$ would be present in very low amounts.

It has been found that reducing the $CH_4$ to $H_2$ ratio in the process gas increases the ratio of neutral single substitutional nitrogen, $N_s^0$, to total single substitutional nitrogen, $N_s$. In other words, as the $CH_4$ to $H_2$ ratio reduces, the relative amount of $N_s^0$ as a fraction of total $N_s$ increases.

Figure 3:
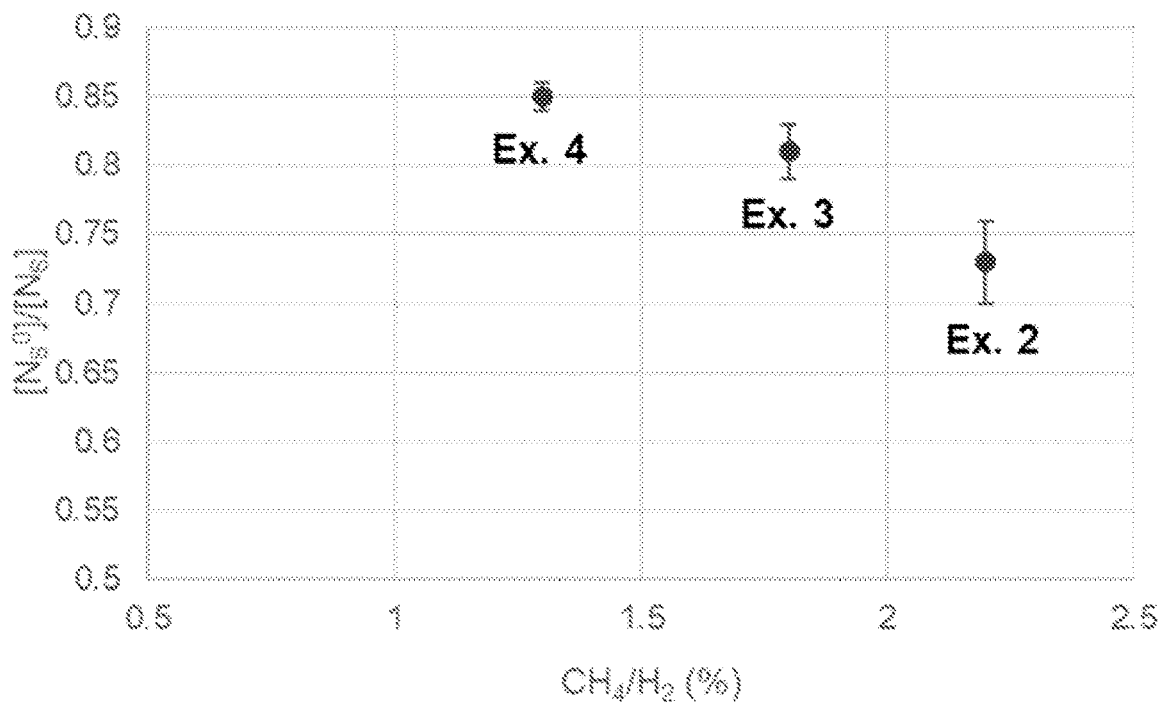
FIG. 3 is a graph showing a relationship between the ratio of $CH_4$ and $H_2$ in the process gas and the ratio of neutral single substitutional nitrogen, $N_s^0$, to total single substitutional nitrogen, $N_s$.

FIG. 3 shows a relationship between the ratio of $CH_4$ and $H_2$ in the process gas and the ratio of neutral single substitutional nitrogen, $N_s^0$, to total single substitutional nitrogen, $N_s$. Example 2 had a ratio of 0.73, Example 3 had a ratio of 0.81 and example 4 had a ratio of 0.85. Comparative Example 1 had a ratio of around 0.55. For applications where it is desirable to convert substitutional nitrogen into NV centres, a high ratio of $N_s^0$ to total $N_s$ is required. Comparative example 1 had a much lower ratio than examples 2 to 4.

It has been found that the higher the amount of $N_s^0$ as a fraction of the total amount of $N_s$, the better the colour of the synthetic CVD diamond material is. 'Better colour' is used here to mean that the amount of brown colouration is reduced. This assists with reducing absorption, which means that an $NV^-$ centre in a device can be better interrogated without loss of information. Furthermore, a higher fraction of $N_s^0$ as a fraction of the total amount of $N_s$ is thought to contribute to a good $T_2^*$ for an NV centre. It is possible that this is because there are fewer defects that have paramagnetic charge states, and so do not reduce the decoherence time as much.

Turning now to colour, the perceived colour of an object depends on the transmittance/absorbance spectrum of the object, the spectral power distribution of the illumination source and the response curves of the observer's eyes. The CIE L*a*b* chromaticity coordinates (and therefore hue angles) referred to below have been derived in the way described below. Using a standard D65 illumination spectrum and standard (red, green and blue) response curves of the eye, CIE L*a*b* chromaticity coordinates of a parallel-sided plate of diamond have been derived from its transmittance spectrum using the relationships below, between 350 nm and 800 m with a data interval of 1 nm:

$S_\lambda$=transmittance at wavelength λ
$L_\lambda$=spectral power distribution of the illumination
$x_\lambda$=red response function of the eye $y_\lambda$=green response function of the eye
$z_\lambda$=blue response function of the eye $$X=\Sigma_\lambda[S_\lambda x_\lambda L_\lambda]/Y_0$$

$$Y=\Sigma_\lambda[S_\lambda y_\lambda L_\lambda]/Y_0$$

$$Z=\Sigma_\lambda[S_\lambda z_\lambda L_\lambda]/Y_0$$

Where $Y_0=\Sigma_\lambda y_\lambda L_\lambda$ $$L^*=116(Y/Y_0)^{1/3}-16=\text{Lightness (for } Y/Y_0>0.008856)$$

$$a^*=500[(X/X_0)^{1/3}-(Y/Y_0)^{1/3}] \text{(for } X/X_0>0.008856, Y/Y_0>0.008856)$$

$$b^*=200[(Y/Y_0)^{1/3}-(Z/Z_0)^{1/3}] \text{(for } Z/Z_0>0.008856)$$

$$C^*=(a^{*2}+b^{*2})^{1/2}=\text{saturation}$$

$$h_{ab}=\arctan(b^*/a^*)=hue \text{ angle}$$

L*, the lightness, forms the third dimension of the CIE L*a*b* colour space. The lightness and saturation vary as the optical path length is changed for diamond with particular optical absorption properties. This can be illustrated on a colour tone diagram in which L* is plotted along the y-axis and C* is plotted along the x-axis. The method described in the preceding paragraph can also be used to predict how the L*C* coordinates of diamond with a given absorption coefficient spectrum depend on the optical path length.

The C* (saturation) numbers can be divided into saturation ranges of 10 C* units.

Figure 4:
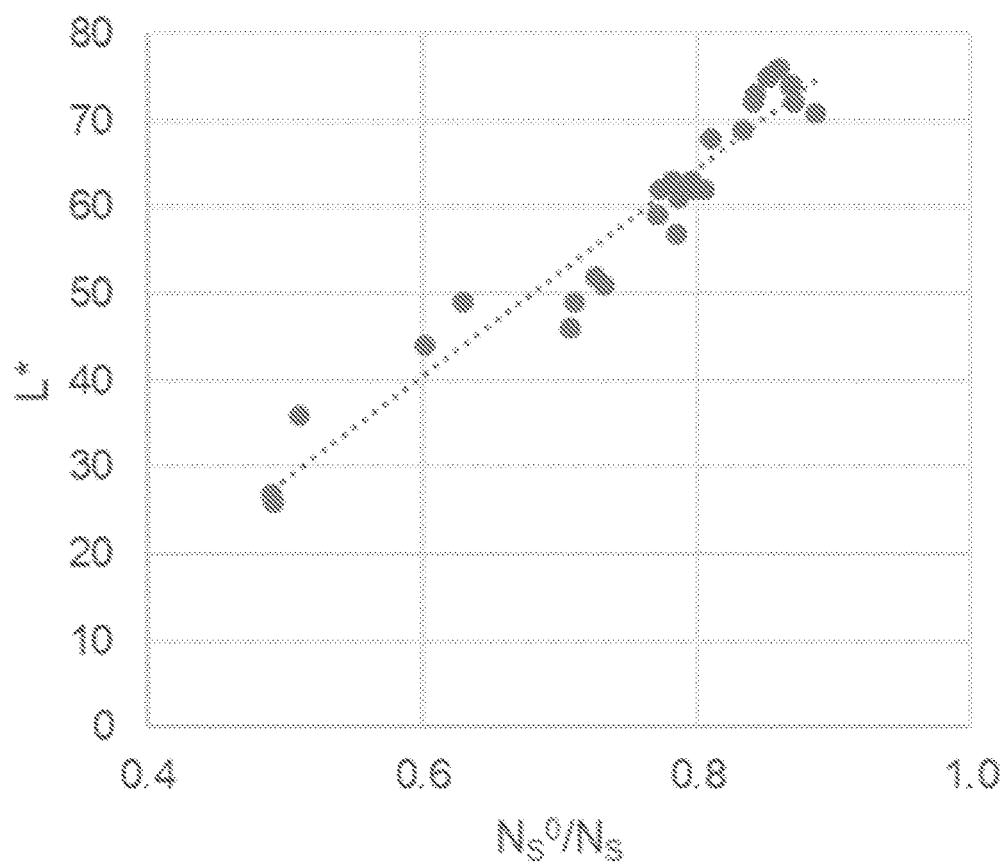
FIG. 4 is a graph showing L* values against the ratio of neutral single substitutional nitrogen, $N_s^0$, to total single substitutional nitrogen, $N_s$.

It was observed that the L* values are independent of $N_s^0$ over the ranges measured, but L* decreases with increasing $N_s^+$. As the total $N_s$ is typically made of up $N_s^0$ with the bulk of the balance being $N_s^+$, it has been observed that L* increases with increasing ratio of $N_s^0$ to $N_s$, as shown in FIG. 4. A higher L* value is indicative of a lighter material, hence the diamond with a higher ratio of $N_s^0$ to $N_s$ is less brown than diamond material with a lower ratio of $N_s^0$ to $N_s$.

Figure 5:
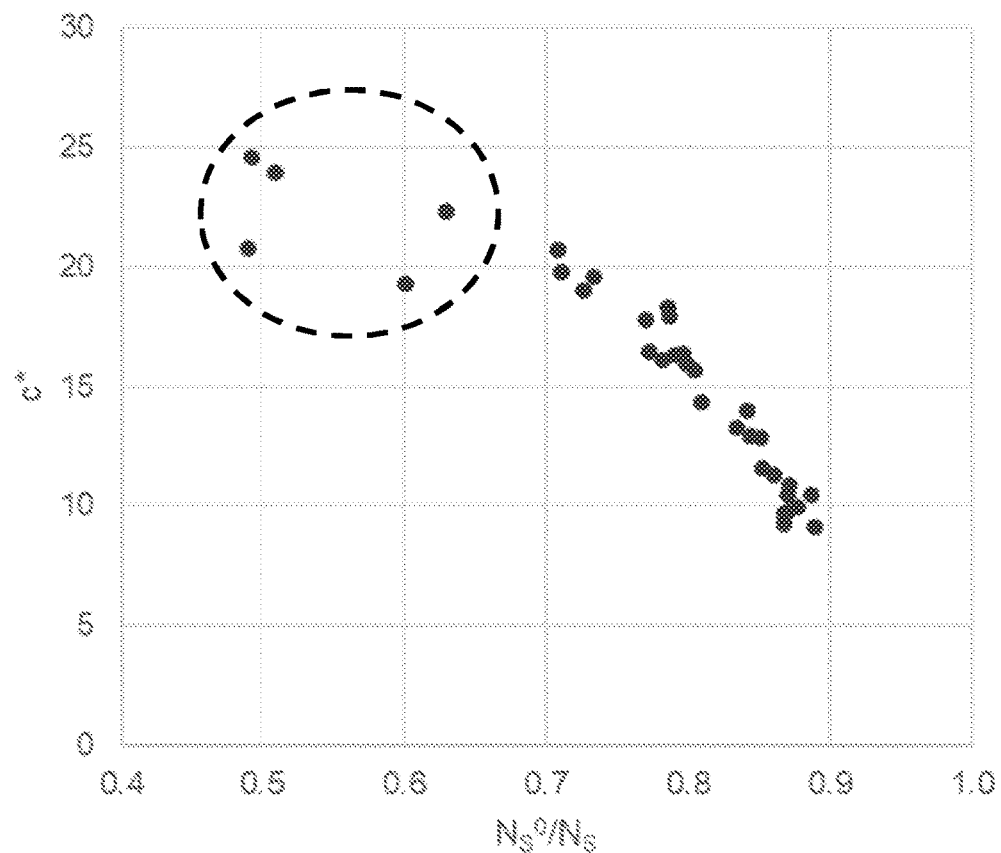
FIG. 5 is a graph showing c* values against the ratio of neutral single substitutional nitrogen, $N_s^0$, to total single substitutional nitrogen, $N_s$.

A strong relationship was also observed between c* and the ratio of $N_s^0$ to $N_s$, as shown in FIG. 5. A lower c* value is indicative of reduced brownness. It can be seen that this relationship did not hold for comparative example 1 (points surrounded by a dashed line) but did hold for values of $N_s^0$ to $N_s$ above 0.70.

It should be noted that the correlation between C* or L* with the Ns0 to $N_s$ ratio can be used as a quick way to obtain an indication of the $N_s^0$ to $N_s$ ratio. C* or L* can be empirically mapped to the $N_s^0$ to $N_s$ ratio, for example by providing a look-up table of values or by fitting an equation relating the C* or L* values to the $N_s^0$ to $N_s$ ratio.

The material produced as described above can be treated to convert a proportion of the $N_s^0$ centres to N-V centres, which are useful in applications such as sensing or quantum computing. N-V centres are typically formed by irradiation and annealing. The annealing may be performed during or after irradiation. NV centres attracted a lot of interest as a useful quantum spin defect because it has several desirable features including:

(i) Its electron spin states can be coherently manipulated with high fidelity owing to an extremely long coherence time (which may be quantified and compared using the transverse relaxation time T2);
(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and
(iii) Its electronic structure comprises emissive and non-emissive electron spin states, which allows the electron spin state of the defect to be read out through photons. This is convenient for reading out information from synthetic diamond material used in sensing applications such as magnetometry, spin resonance spectroscopy and imaging. Furthermore, it is a key ingredient towards using the NV− defects as qubits for long-distance quantum communications and scalable quantum computation. Such results make the NV− defect a competitive candidate for solid-state quantum information processing (QIP).

A problem in producing materials suitable for quantum applications is preventing quantum spin defects such as NV− from decohering, or at least increasing the time a system takes to decohere (i.e. lengthening the "decoherence time"). A long $T_2$ time is desirable in applications such as quantum computing as it allows more time for the operation of an array of quantum gates and thus allows more complex quantum computations to be performed. A long $T_2$ time is also desirable for increasing sensitivity to changes in the electric and magnetic environment in sensing applications. $T_2^*$ is the inhomogeneous spin-spin relaxation time and is shorter than $T_2$ as it includes interactions with the environment. For sensing applications, $T_2^*$ is the coherence time relevant for DC magnetic-field sensing, whereas methods that measure/utilize $T_2$ only detect AC contributions.

One way to increase the decoherence time of quantum spin defects is to ensure that the concentration of other point defects within the synthetic diamond material is low so as to avoid dipole coupling and/or strain resulting in a decrease in decoherence time of the quantum spin defects. However, for thin plates of material (for example, plates of material with a thickness below 100 μm), it has been found that this is still insufficient to achieve very high decoherence times.

Reducing the concentration of the quantum spin defects themselves can increase decoherence times of individual quantum spin defects. However, while this will increase the sensitivity of each individual quantum spin defect, a reduction in the number of quantum spin defects will reduce the overall sensitivity of the material. What is considered important for many quantum sensing applications is the product of the NV− defect concentration and the decoherence time $T_2^*$ of the NV− defects. Preferably, this product should be at least 2.0 ppm μs at room temperature. A higher ratio of $N_s^0$ to $N_s$ gives an improved product value. While the inventors are unaware of a theoretical maximum value for the product, it is currently thought that a product of around 10 ppm·μs is achievable.

Further samples were prepared in order to measure the product of [NV−] and $T_2^*$. Sample 5 contained 14.2 ppm [$N_s^0$] post synthesis. This was electron irradiated and annealed to create 2.5 ppm [NV−] and had a $T_2^*$ (measured at room temperature using a Ramsey method as described below) of 1.0 μs. Thus the [NV]·$T_2^*$ product was 2.5 ppm·μs for example 5.

Example 6 contained 12.7 ppm [$N_s^0$] post synthesis. This was electron irradiated and annealed to create 2.6 ppm [NV−] and had a $T_2^*$ (measured at room temperature using a Ramsey method as described below) of 1.1 ps. Thus the [NV]·$T_2^*$ product was 2.9 ppm·μs for example 6.

Values for $T_2^*$ have been determined via a Ramsey pulse sequence. The simplest on-resonance decay in the NV luminescence (free-induction-decay or "FID") would be single exponential with the desired characteristic decay time $T_2^*$. However, in order to improve the visibility of the decay from the background noise it is typical to detune the microwave frequency slightly away from the resonant NV frequency (the line position as observed in an ODMR frequency scan). This introduces additional oscillations, which are more easily discriminated from the shot-noise background. However for NV, depending on the chosen RF power level, multiple resonance lines for a single NV− defect (or a group of commonly-aligned NV− defects) may be observed, due to the $^{14}N$ hyperfine interaction ($^{14}N$ has nuclear spin 1).

The experimentally observed FID is therefore commonly fitted to a decay given by the following expression:

$$I = \exp[-(\tau/T_2^*)^\varepsilon] \Sigma_{m=-1}^{m=+1} \beta_m \cos[2\pi(\delta + mA_N)\tau]$$

where $\tau$ is the free procession time interval, $\varepsilon$ is a factor to permit the quality of the fit to be improved ($\varepsilon$=1.0 is ideal), $\beta_m$ is the weighting of each hyperfine contribution ($\beta_{1,2,3}$=⅓ is ideal) and $\delta$ is the detuning away from the central NV line position.

By least-square fitting the determined FID curve to the expression in the above equation, the optimum value of $T_2^*$ can be determined. This is taken to be the NV⁻ $T_2^*$ value, with an uncertainty defined by the quality of fit.

It is known that different irradiating and annealing regimes can lead to an increased concentration of [NV⁻] in diamond, and it is likely that further irradiation and annealing of similar materials to examples 5 and 6 would increase [NV⁻] without reducing $T_2^*$, and so an [NV]·$T_2^*$ product with such recipes is higher.

For sensing applications where the NV⁻ centre is used, the single crystal synthetic CVD diamond material may be grown with a thickness of anywhere from around 100 nm to around 4 mm, although it might typically be grown to a thickness of between 500 nm and 50 μm.

Figure 6:
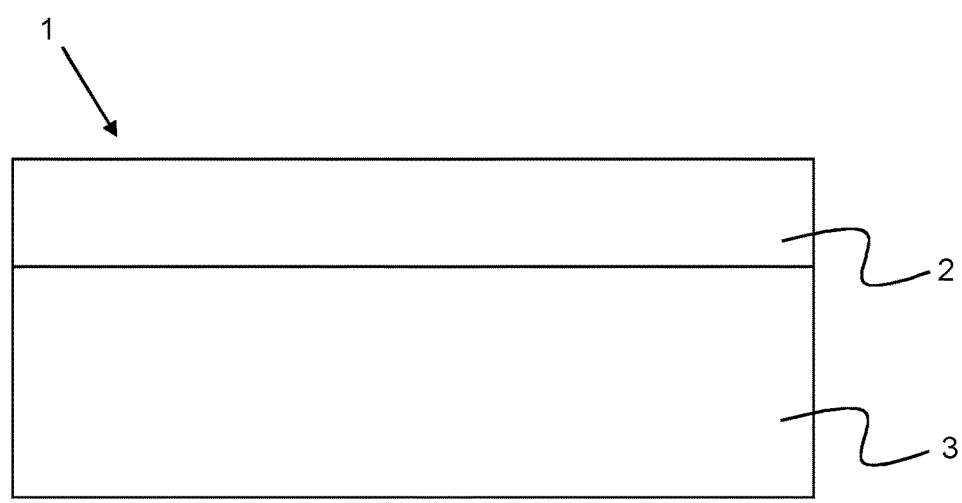
FIG. 6 illustrates schematically a composite diamond material including diamond with two different compositions.

Furthermore, where the single crystal synthetic CVD diamond material is to be used in sensing applications, it may be overgrown onto a further diamond material with a much lower concentration of solid substitutional nitrogen, as shown in FIG. 6. FIG. 6 shows a composite diamond 1 having a first layer 2 of diamond grown as described above with a total nitrogen concentration of at least 5 ppm and a neutral single substitutional nitrogen, $N_s^0$, to total single substitutional nitrogen, $N_s$, ratio of at least 0.70, and a second layer 3 of diamond with a total nitrogen concentration lower than that of the first layer 2. This may be achieved by growing one layer on top of the other, or altering the source gases in the microwave reactor to create layers with different concentrations of nitrogen. An advantage of this is that the second layer of diamond 3 is not grown under the same conditions as the first layer, and so a less expensive growth regime may be used for the second layer that grows diamond that is less pure or grows more quickly. This composite diamond 1 therefore has a high nitrogen layer in which irradiated and annealed NV⁻ centres can be used, but has an overall thickness that allows for easier handling and mechanical strength. A further advantage of this technique is that making the first layer sufficiently thin allows generated NV− centres to be effectively isolated when viewed throughout the thickness of the composite diamond 1. The second layer 3 may be formed from, for example, CVD diamond, HPHT diamond, natural diamond, or anneal CVD, HPHT, or natural diamond.

Similarly, overgrowth techniques using masking can be used to give a material with a first surface region of diamond with a total nitrogen concentration of at least 5 ppm and a neutral single substitutional nitrogen, $N_s^0$, to total single substitutional nitrogen ratio of at least 0.70, and an adjacent second surface region with a total nitrogen concentration lower than that of the first surface region. For example, the second layer described can be grown, a mask placed over the second layer, and the first layer overgrown so that the first layer only grows on the second layer in a region exposed by the mask. Further masking can be used to build more complicated layers with different types of diamond on different parts of the surface.

Owing to the low number of defects, the optical birefringence of the material is typically such that at a temperature of 20° C., in a sample measured over an area of at least 3 mm×3 mm, for 98% of the area analysed, the sample remains in first order ($\delta$ does not exceed $\pi/2$), and the maximum value of $\Delta n_{[average]}$, the average value of the difference between the refractive index for light polarised parallel to the slow and fast axes averaged over the sample thickness does not exceed $5 \times 10^{-5}$. A description of this measure of birefringence may be found in WO 2004/046427.

In order to measure the strain in the first layer, a technique is used as described in "Imaging crystal stress in diamond using ensembles of nitrogen-vacancy centers", Kehayias et. al., Phys. Rev. B 100, 174103. This paper describes a micrometer-scale-resolution quantitative stress imaging method with millimetre-scale field-of-view for diamonds containing a thin surface layer of nitrogen-vacancy (NV) centres, such as those described above. Stress tensor elements are reconstructed over a two-dimensional field of view from NV optically detected magnetic resonance (ODMR) spectra to study how stress inhomogeneity affects NV magnetometry performance.

A portion of the surface of the first layer is imaged over an area of at least 1×1 mm. Within this area, at least 90 percent of points display a modulus of strain-induced shift of NV resonance of less than 200 kHz. Each point in the area is a resolved region of 50 μm². This gives an indication of the uniformity of the strain.

On the surface of the first layer, there may be discontinuities or damage that could cause local region of strain. In an embodiment, the area is located within a central 70% of the area of the surface in order to avoid high strain regions that might be found toward the edges of a single crystal sample. Within this area, there are no series of more than 1000 contiguous points having a modulus of strain-induced shift of NV resonance lines exceeding 150 kHz. In a further embodiment, there may be no series of more than 500 contiguous points having a modulus of strain-induced shift of NV resonance lines exceeding 150 kHz.

For some applications where NV− centres are required, the presence of $^{13}C$ can be detrimental to the properties of the diamond as it has a non-zero nuclear spin. It therefore may be preferred to use a carbon containing gas in the source gas that in which at least 99% of the carbon is $^{12}C$, at least 99.9% of the carbon is $^{12}C$ or at least 99.99% of the carbon is $^{12}C$.

The invention allows synthetic CVD diamond to be produced with a high level of incorporated nitrogen but still acceptable levels of brown colouration for use in sensing applications where the NV centre is used. It has been found that the brown colouration can be controlled by controlling the ratio of carbon in a carbon-containing source to hydrogen atoms in the hydrogen gas, which in turn affects the ratio of $N_s^0$ to total $N_s$ incorporated in the resultant CVD synthetic diamond. The ratio of $N_s^0$ to total $N_s$ affects the colour of the diamond and a higher ratio leads to less brown colouration.

The invention as set out in the appended claims has been shown and described with reference to embodiments. However, it will be understood by those skilled in the art that various changes in form and detail may be made without departing from the scope of the invention as defined by the appended claims, and while exemplary methods have been described, it may be that other methods may be used to obtain the diamond material of the appended claims.

What is claimed is:

1. A method of making single crystal CVD diamond comprising a total nitrogen concentration of at least 5 ppm and a neutral single substitutional nitrogen, $N_s^0$, to total single substitutional nitrogen, $N_s$, ratio of at least 0.7, the method comprising:
   locating a single crystal diamond substrate over a substrate holder within a chemical vapour deposition reactor;
   feeding process gases into the reactor, the process gases comprising 60 to 200 ppm nitrogen, a carbon-containing gas and hydrogen, wherein a ratio of carbon atoms in the carbon-containing gas to hydrogen atoms in the hydrogen gas is 0.5 to 1.5%; and
   growing single crystal CVD diamond material on a surface of the single crystal diamond substrate.

2. The method according to claim 1, wherein the ratio of carbon atoms in the carbon-containing gas to hydrogen atoms in the hydrogen gas is no more than 1.0%.

3. The method according to claim 1, the method further comprising locating a plurality of single crystal diamond substrates over the substrate holder.

4. The method according claim 1, further comprising irradiating and annealing the diamond material to increase a number of NV⁻ defects in the diamond material.

5. The method according claim 1, wherein the single crystal diamond substrate has a total nitrogen concentration of less than 5 ppm.

6. The method according to claim 1, further comprising applying a mask to the diamond substrate prior to growing the single crystal CVD diamond material on the surface of the single crystal diamond substrate.

7. The method according to claim 1, wherein the carbon in the carbon-containing gas comprises any of at least 99 percent $^{12}C$; at least 99.9 percent $^{12}C$; and at least 99.99 percent $^{12}C$.

8. The method according to claim 1, wherein the single crystal CVD diamond material is grown to a thickness selected from any of 100 nm to 4 mm, 200 nm to 1 mm, or 500 nm to 50 μm.

* * * * *